(12) United States Patent
Yamamoto et al.

(10) Patent No.: US 7,811,899 B2
(45) Date of Patent: Oct. 12, 2010

(54) METHOD FOR LAMINATING SUBSTRATE AND APPARATUS USING THE METHOD

(75) Inventors: Masayuki Yamamoto, Ibaraki (JP); Yukitoshi Hase, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 43 days.

(21) Appl. No.: 11/949,593

(22) Filed: Dec. 3, 2007

(65) Prior Publication Data
US 2008/0138936 A1 Jun. 12, 2008

(30) Foreign Application Priority Data
Dec. 6, 2006 (JP) .............................. 2006-329730

(51) Int. Cl.
H01L 23/58 (2006.01)
H01L 21/30 (2006.01)
H01L 21/46 (2006.01)
B23B 41/00 (2006.01)
B23B 41/02 (2006.01)

(52) U.S. Cl. .............................. 438/455; 257/E21.122; 156/60; 156/358

(58) Field of Classification Search .............. 438/455; 257/E21.122; 156/60, 358
See application file for complete search history.

(56) References Cited

U.S. PATENT DOCUMENTS

| 5,961,768 A * | 10/1999 | Tsujimoto ............... 156/285 |
| 6,841,027 B2 * | 1/2005 | Muffler .................. 156/286 |
| 2007/0296035 A1 * | 12/2007 | George et al. .......... 257/347 |

FOREIGN PATENT DOCUMENTS

| JP | 2000-349136 A | 12/2000 |
| JP | 2002-313688 | * 10/2002 |

* cited by examiner

Primary Examiner—W. David Coleman
(74) Attorney, Agent, or Firm—Cheng Law Group, PLLC (57) ABSTRACT

A supporting substrate is laminated on a wafer in such a manner that the supporting substrate locked in peripheral edges with a plurality of locking claws is disposed in proximity to and facing to an adhering surface of a double-sided adhesive sheet on the workpiece, the supporting substrate is pressed by a pressing member made of an approximately hemispherical elastic body from an approximate center of a non-adhering surface of this supporting substrate, the supporting substrate is laminated by elastically deforming this pressing member on the wafer while making the supporting substrate surface contact in a flat condition.

22 Claims, 8 Drawing Sheets

METHOD FOR LAMINATING SUBSTRATE AND APPARATUS USING THE METHOD

BACKGROUND OF THE INVENTION (1) Field of the Invention

The present invention relates a method for laminating a substrate, wherein a substrate for reinforcement (for support) is laminated onto various kinds of substrates, such as semiconductor wafers, glass substrates, and wiring boards through a double-sided adhesive sheet, and to an apparatus using the method.

(2) Description of the Related Art

Semiconductor wafers (hereinafter referred to as "wafer") are obtained in a manner that the back side of the wafer is ground by a back grinding process after formation of a large number of elements on the wafer, and subsequently the wafer is cut into each element in a dicing process. However, as demand for a higher density packaging increases in recent years, a smaller wafer thickness level from 100 micrometers to 50 micrometers, and furthermore a level of approximately 25 micrometers tend to be needed. The wafer that has been subjected to back grinding into such a level of thickness may have possible brittleness and distortion, leading to extremely poor handling property.

Accordingly, a method of reinforcement of the wafer by lamination of a substrate having rigidity such as a glass plate etc. to a wafer through an adhesive sheet has been proposed and is in practical use.

In detail, a wafer having an adhesive tape beforehand applied on the top face thereof is mounted in a holding stand, and a base made of a glass plate etc. (a substrate in the present invention) is held at the upper end of a base supporting section in a slanting attitude over this wafer. In this condition, a press roller is moved to the surface of the base held in a slanting attitude, the base supporting section is lowered corresponding to the movement, thereby laminating the base onto the semiconductor wafer (refer to JP-A No. 2000-349136).

However, since lamination of the wafer to the substrate for reinforcement is performed after beforehand lamination of an adhesive tape to an extremely thin-finished wafer in conventional apparatuses for laminating a base, the function of an external force in lamination of the adhesive tape to the wafer may damage the wafer.

In the case of the lamination to the wafer by pressing with the rolling motion of the press roller on the surface of the base, a pressing force will be applied in a rolling direction of the press roller, resulting in an unexpected gap of the lamination position of a substrate in the rolling direction.

SUMMARY OF THE INVENTION

The present invention aims at providing a method for laminating a substrate allowing accurate and precise lamination of a substrate and a semiconductor wafer without breakage of workpieces, such as semiconductor wafers and an unexpected gap of a lamination position of the supporting substrate etc. and the present invention also aims at providing an apparatus using the method.

The present invention employs following configurations in order to achieve such objects.

In the method for laminating a supporting substrate to a workpiece by interposition of a double-sided adhesive sheet, the method comprising:

applying the double-sided adhesive sheet on the workpiece;
performing position control of the workpiece and the substrate in a proximate and mutually facing condition with interposition of the laminated double-sided adhesive sheet by holding peripheral edges of the substrate with a plurality of holding devices;

laminating the substrate on the workpiece by pressing the substrate from the approximate center of a non-adhering surface of the substrate with a pressing member made of an elastic body having an approximately hemispherical shape, and by elastically deforming the pressing member into a flat shape to make a surface of the substrate contact to the wafer; and moving the holding devices outward in a radial direction of the substrate by canceling hold of the substrate by the holding device when a pressed contact surface to the surface of the substrate by elastic deformation of the pressing member approaches the peripheral edge of the substrate.

According to the method for laminating the substrate of the present invention, the approximately hemispherical pressing member made of an elastic body presses the substrate from the approximate center of the non-adhering surface side thereof. Thereby, the pressing member will elastically deform from the center to the peripheral edge of the substrate while radially increasing a contact area. Accordingly, the pressing force by the pressing member will also be uniformly applied from the center to the peripheral edge of the substrate, thereby eliminating air bubbles outside that may possibly be involved within a lamination face. As a result, the unexpected gap of the lamination position of the substrate and breakage of the workpiece can be suppressed. And thus high-quality lamination that can avoid involved air bubbles within a lamination face may be attained.

The lamination process is preferably carry out by following methods.

For example, in an example, the edges of a plurality of holding devices are swung with diagonal drop associated with a curvature caused by pressing of the surface of the substrate by the pressing member.

Furthermore, in an other example, a plurality of holding devices is swung with diagonal drop associated with a curvature caused by pressing of the surface of the substrate by the pressing member.

Both the above-described methods do not accumulate the stress by curvature in the substrate. That is, lamination of the substrate in a curved state on the workpiece will be avoided.

In an other example, the hardness of the pressing member is increased from the top end in contact with the substrate to the attached base end side.

According to this method, the pressing member has a lower hardness in the top end side than that of the base end side, leading to easier elastic deformation.

That is, contact of the pressing member along with the surface of the substrate in a flat condition may be easily obtained, and the hardness of the whole pressing member increases when the pressing member reaches a threshold value of elastic deformation.

Accordingly, operation of the uniform pressing force to the surface of the substrate may be achieved.

Furthermore, the hardness of the pressing member is radially increased from the center at the top end in contact with the substrate.

According to this method, since the hardness in the center side at the top end of the pressing member is lower than the hardness in the base end side, easier elastic deformation may be obtained. That is, contact of the pressing member along with the surface of the substrate in a flat condition may be easily obtained, and the hardness of the whole pressing member increases when the pressing member reaches a threshold value of elastic deformation.

Accordingly, operation of the uniform pressing force to the surface of the substrate may be achieved.

In an other example, a flat surface is formed at the top end of the pressing member to be in contact with the substrate, and the pressing member is contacted to the substrate first from this flat surface gradually to the outer direction.

This method can suppress the local action of the pressing force caused by the pressing member in the center of the substrate. In other words, the method distributes the pressing force in a radial direction of the substrate, allowing action of an approximately uniform pressing force.

In each of the above-described methods, the lamination of the supporting substrate to the workpiece is preferably performed under a decompressed atmosphere in the lamination process.

This method can eliminate possible involvement of the air bubbles in the lamination surface between the workpiece and the substrate more reliably than by usual methods.

In addition, the same effect can be obtained in each of the above-described methods, when the workpiece is laminated onto the substrate instead of the substrate.

Furthermore, the present invention employs following configurations, in order to achieve the objects.

An apparatus for laminating a supporting substrate to a workpiece by interposition of a double-sided adhesive sheet, the apparatus comprising:
a holding table for holding a non-adhering surface of the workpiece having the double-sided adhesive sheet laminated thereon;
a plurality of holding device for holding a plurality of peripheral edges of the substrate and for disposing in proximity the substrate opposed to an adhering surface of the double-sided adhesive sheet on the workpiece held on the holding table;
a laminating device having a pressing member made of an approximately hemispherical elastic body, the pressing member pressing the non-adhering surface of the substrate held on the holding device, the laminating device laminating the substrate on the workpiece while making the surface of the substrate contact to the workpiece by elastically deforming the pressing member flat;
a driving device for moving the holding devices outward in a radial direction of the substrate by canceling hold of the substrate by the holding device corresponding to the elastic deformation of the pressing member.

The apparatus for laminating the substrate of the present invention can laminate the substrate to the workpiece by disposing in proximity the substrate that is opposed to an adhering surface of a double-sided adhesive sheet on the workpiece held on a holding table, and by pressing a pressing member from a non-adhering surface side of this substrate. In the process of lamination of the substrate to the workpiece, the substrate can be perfectly laminated on the workpiece by canceling hold by the holding device corresponding to the elastic deformation of the pressing member, and by moving the holding device in an outward direction of the substrate. That is, the object of the present invention may suitably be attained.

In addition, the pressing member in the apparatus of this invention preferably has a flat surface at a top end of the hemispherical elastic body providing a starting position of contact.

This configuration can suppress the local action of the pressing force caused by the pressing member to the substrate. In other words, the configuration distributes the pressing force in a radial direction of the substrate, allowing action of an approximately uniform pressing force.

Furthermore, the hardness of the pressing member of the apparatus of the invention preferably becomes higher from the top end to the attached base end side.

According to this configuration, since the hardness in the center side at the top end of the pressing member is lower than the hardness in the base end side, easier elastic deformation may be achieved. That is, contact of the pressing member in a flat state along with the surface of the substrate may easily be obtained, and the hardness of the whole pressing member rises when the elastic deformation reaches a threshold value, allowing action of a uniform pressing force to the surface of the substrate.

In addition, the hardness of the pressing member is radially increased from the center at the top end in contact with the substrate.

The holding device in the apparatus of the invention is preferably configured with a plurality of locking claws for locking the peripheral edge of the workpiece.

This configuration may reduce the contact area by hold of the substrate, allowing decrease of pollution of the adhering surface.

And the locking claws are preferred to be configured so as to operate in a following manner.

For example, the end of a plurality of the locking claws diagonally swings down associated with a curvature formed by pressing of the surface of the substrate by the pressing member.

Furthermore, the plurality of the locking claws diagonally descends associated with a curvature formed by pressing of the surface of the substrate by the pressing member.

At least the holding table, holding device, and laminating device of the apparatus of the invention are preferably accommodated in a decompression chamber. This configuration can positively eliminate air bubbles to be possibly involved in the adhering surface between the workpiece and the substrate.

Here, the configuration for holding the substrate and the workpiece may be reversed.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, one example of the present invention will be described with reference to the drawing.

Figure 1:
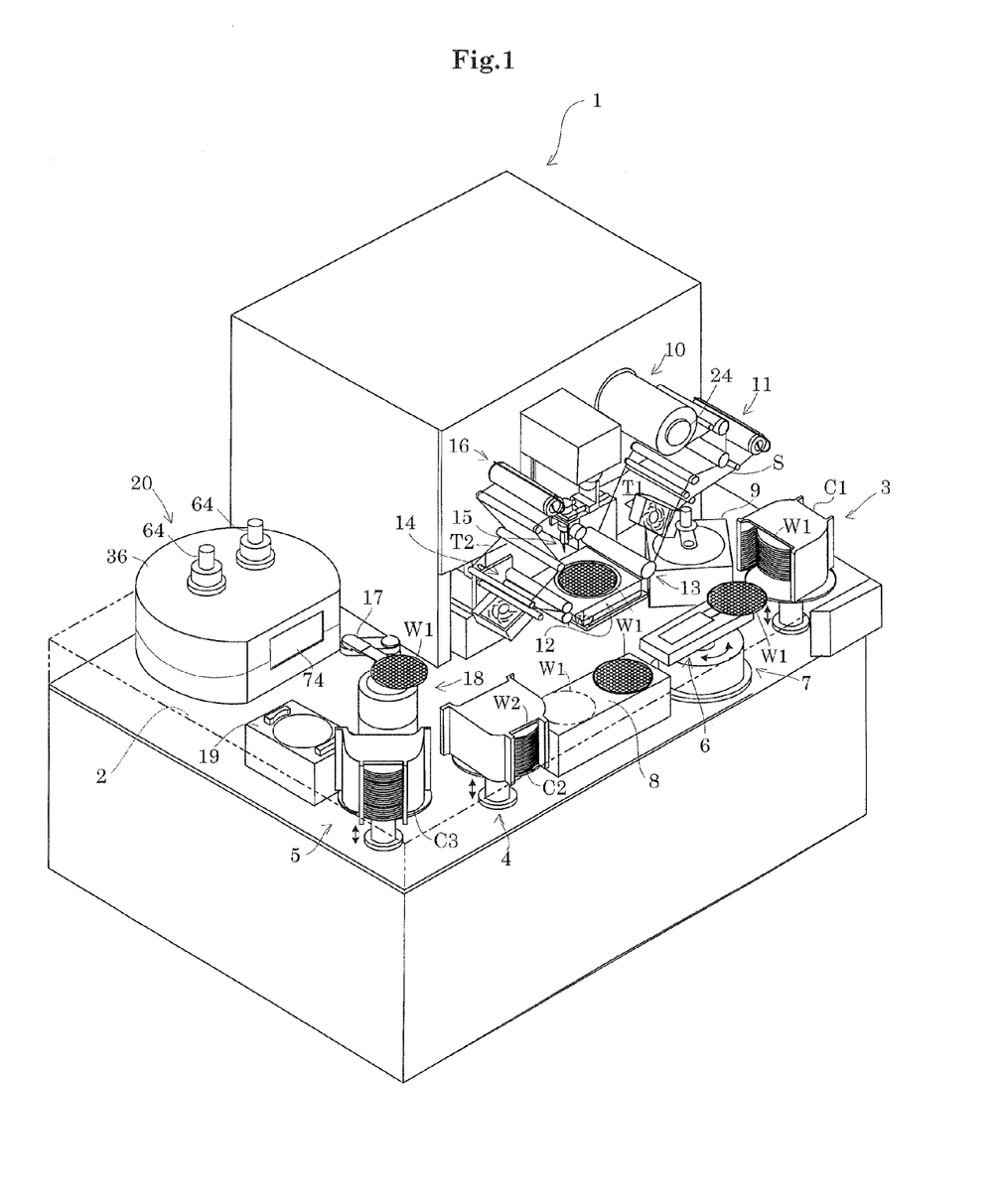
FIG. 1 is a perspective view of an apparatus for laminating a substrate of the present invention.
Figure 2:
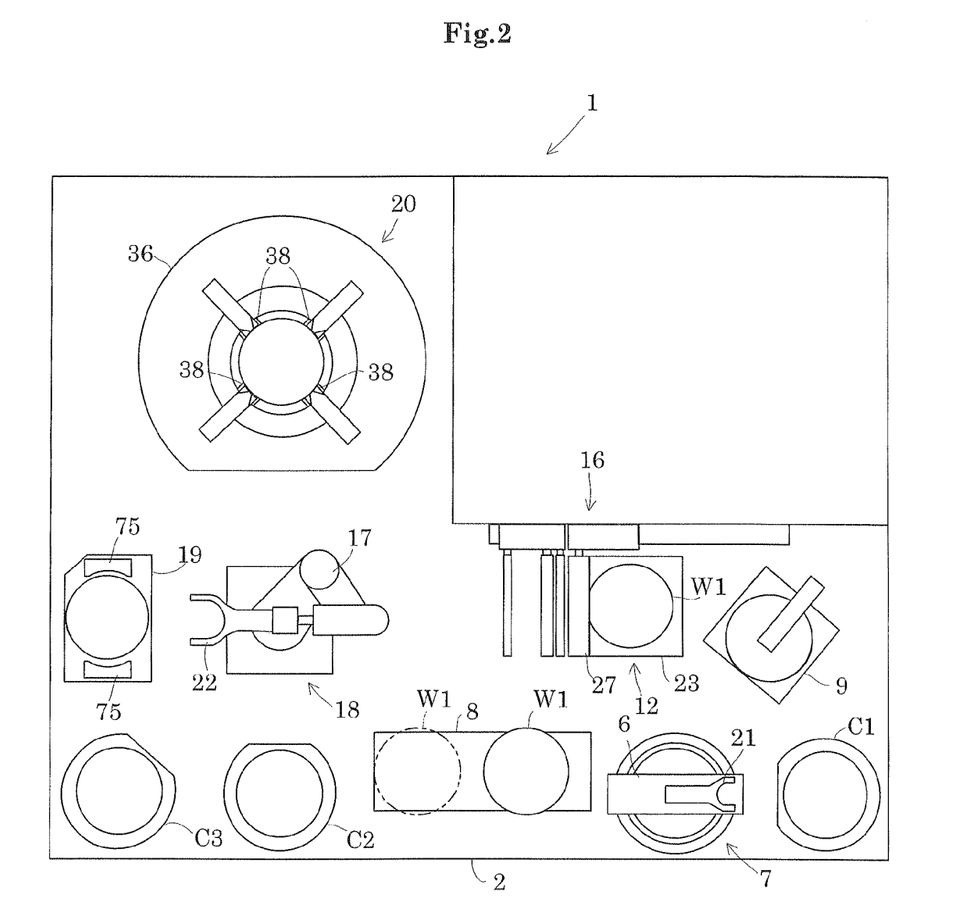
FIG. 2 is a plan view illustrating an entire configuration of an apparatus for laminating a substrate of the present invention.

FIG. 1 illustrates a plan view of an apparatus for laminating a substrate that performs the method for laminating a substrate by the present invention. FIG. 2 illustrates a front view thereof.

The apparatus for laminating a substrate 1 of this example, as illustrated in FIG. 1, comprises a wafer feed section 3 for loading a cassette C1 that stores a semiconductor wafer W1 (hereinafter referred to only as "wafer W1") at the front right of a base 2; a supporting substrate feed section 4 for loading a cassette C2 that stores a supporting substrate W2 as a reinforcing substrate having almost the same shape as that of the wafer at the center front of the base 2, the supporting substrate being made of a glass plate, a stainless steel, etc.; and a wafer collecting section 5 for collecting the wafer W1 having the supporting substrate W2 laminated thereto into a cassette C3 at the front left of the base 2. A first transport mechanism 7 provided with a robot arm 6, and a second transport mechanism 8 that horizontally transports wafer W1 with a conveying belt are arranged between the wafer feed section 3 and the supporting substrate feed section 4. Furthermore, a first alignment stage 9 is arranged in the inner part of right side of the base 2. In the upper part, an adhesive sheet feed section 10 for supplying a double-sided adhesive sheet T1 to the wafer W1 is arranged. A separator collecting section 11 is arranged for collecting only the separators S from a double-sided adhesive sheet T1 with a separator that has been supplied from the adhesive sheet feed section 10, diagonally below to the right direction of the adhesive sheet feed section 10. On the left of the alignment stage 9 are provided a holding section 12 for holding the wafer W1; a sheet laminating device 13 for laminating the double-sided adhesive sheet T1 to the wafer W1 held in this holding section 12; and a sheet separating mechanism 14 for separating an unnecessary sheet T2 after laminating of the double-sided adhesive sheet T1 to the wafer W1 are arranged on the left of the alignment stage 9. A cutter unit 15 for cutting the double-sided adhesive sheet T1 laminated on the wafer W1 along with the contour of the wafer W1 is arranged in the upper part of the holding section 12. A sheet collecting section 16 for collecting the unnecessary sheet T2 is arranged in the left-hand side upper part. A third transport mechanism 18 provided with a robot arm 17 is arranged on the left of the sheet laminating device 13. A second alignment stage 19 is arranged on the left. Furthermore, a mechanism for laminating a substrate 20 for laminating the wafer W1 and the supporting substrate W2 is arranged in the left-hand side back. Hereinafter, each configuration will be specifically described.

The wafer feed section 3, the supporting substrate feed section 4, and the wafer collecting section 5 are provided with a cassette base that can ascend and descend. The cassettes C1 to C3 stored in each cassette base store the wafer W1, the supporting substrate W2, and the wafer W1 with the supporting substrate in multi-stage, respectively. At this time, within the cassette C1 and C3, the wafer W1 is maintaining a horizontal attitude with a pattern surface side facing upward.

The first transport mechanism 7 and the third transport mechanism 18 are provided with the robot arms 6 and 17, and rotated with a drive mechanism (not illustrated).

As illustrated in FIG. 2, the robot arms 6 and 17 are provided with substrate holding sections 21 and 22 with a horseshoe shape at the edge thereof. Each of the substrate holding sections 21 and 22 has a sucking hole (not illustrated), and sucks the wafer W1 and the supporting substrate W2 that have been stored in the cassette C1 and C2 with vacuum from the back side thereof. In addition, the shape of the substrate holding sections 21 and 22 is not limited to a horseshoe shape, but the shape may be rectangular, round, etc.

That is, while the robot arm 6 suction-holds the wafer W1 from the back side through a clearance between the wafers W1 stored in the cassette C1 in a multi-stage after movement of the substrate holding section 21, and the robot arm 6 transports the held wafer 1 in order of a first alignment stage 9 (described later), the holding section 12, and the second transport mechanism 8. The robot arm 17 transports the wafer W1 with the double-sided adhesive sheet transported by the second transport mechanism 8 in order of a second alignment stage 19 and the mechanism for laminating a substrate 20.

Furthermore, after movement of the substrate holding section 22, the robot arm 17 transports the suction-held supporting substrate W2 in order of a second alignment stage 19 (described later) and the mechanism for laminating a substrate 20, while suction-holding the supporting substrate W2 from the back side through the clearance between the supporting substrate W2 stored in a multi-stage in the cassette C2. Then, the robot arm 17 transports the wafer W1 after lamination of the supporting substrate W2 in the mechanism for laminating a substrate 20 to the cassette C3.

The second transport mechanism 8 is a conveyor type transport mechanism configured with a transportation roller or an endless belt. That is, the second transport mechanism 8 horizontally transports the wafer W1 with the double-sided adhesive sheet transported by the robot arm 6 in a position allowing free receive and deliver to the robot arm 17.

The first alignment stage 9 performs position control based on an orientation flat or a notch, etc. of the mounted wafer W1 with an approximately circular shape.

The second alignment stage 19 performs position control of the wafer W1 based on an orientation flat etc. in the same manner as in the first alignment stage 9. Furthermore, the second alignment stage 19 determines a center position for the supporting substrate W2 by catch with a pair of locking claws 75.

Figure 6:
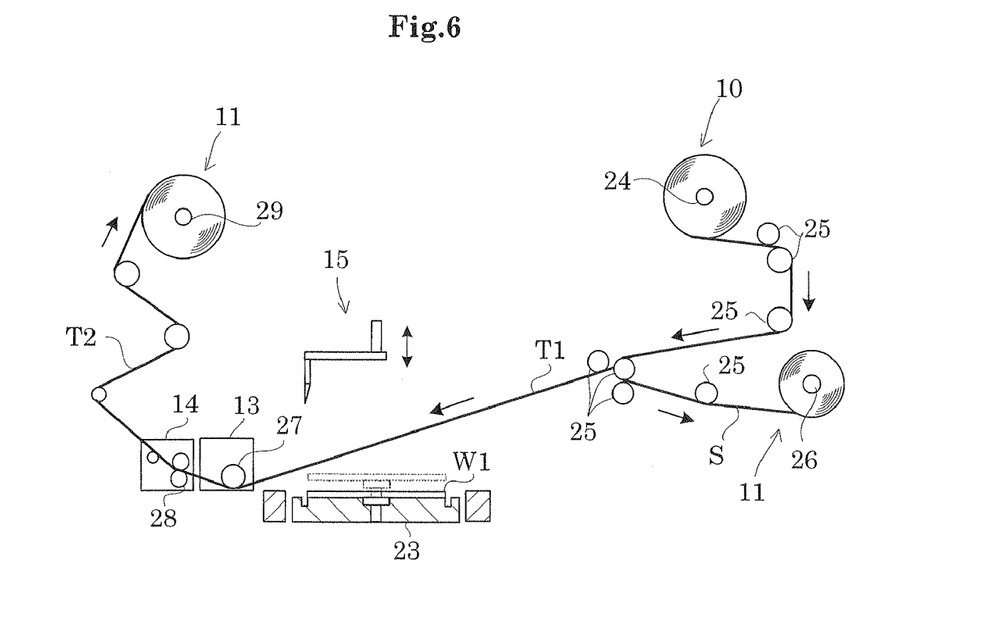
FIGS. 6 to 9 are view illustrating a laminating operation of a double-sided adhesive sheet.

As illustrated in FIG. 6, the holding section 12 has a chuck table 23 for receiving the wafer W1 with a suction pad that ascends and descends in the center, and for suction-holding the wafer W1 with face contact between the back side of the wafer W1 and the whole holding section 12. Here, the chuck table 23 is equivalent to the holding table of the present invention.

In the adhesive sheet feed section 10, the double-sided adhesive sheet T1 having an adhesive strength that reduces by heat expansion is wound with the separator S on a bobbin 24. Furthermore, the double-sided adhesive sheet T1 with the separator S delivered out from this bobbin 24 is guided to a guide roller 25 group with rolling delivery. The adhesive sheet feed section 10 is supported by a vertical wall of the main body of the device, and the rotation thereof is controlled through a brake mechanism etc.

In the separator collecting section 11, a collecting bobbin 26 is supported by a vertical wall, and operatively connected with a drive mechanism, such as a motor.

The sheet laminating device 13 is gripped by a rail of the main body of the device so that the frame thereof may be slidable in the sheet running direction, and is operatively connected through a driving unit, such as a motor (not illustrated). A laminating roller 27 is rotatably supported to the frame. That is, the laminating roller 27 laminates the double-sided adhesive sheet T1 on the surface having irregularity of the wafer W1 while the laminating roller 27 presses the surface of the double-sided adhesive sheet T1 with rolling. The cutter unit 15 ascends and descends between a waiting position and an action position for cutting the double-sided adhesive sheet T1 by an elevator (not illustrated). Furthermore, the cutter unit 15 cuts the double-sided adhesive sheet T1 into a shape of the wafer by rotation of a cutter blade along with the contour of the wafer W1.

The sheet separating mechanism 14 is gripped by a rail of the main body of the device so that the frame may be slidable in the sheet running direction, and is operatively connected through a driving unit, such as a motor (not illustrated). A separating roller 28 is rotatably supported to the frame. Furthermore, this separating roller 28 swings up and down by a cylinder (not illustrated) etc. The separating roller 28 separates an unnecessary double-sided adhesive sheet T2 after cutting from the supporting substrate W2.

In the sheet collecting section 16, a collecting bobbin 29 is supported by a vertical wall of the base 2, and operatively connected with a drive mechanism, such as a motor. That is, the unnecessary sheet T2 after cutting of the double-sided adhesive sheet T1 is taken up by the collecting bobbin 32 by the operation of the driving unit, while the double-sided adhesive sheet T1 of a predetermined quantity is delivered out from the sheet feed section 11 and supplied on the wafer W1.

Figure 4:
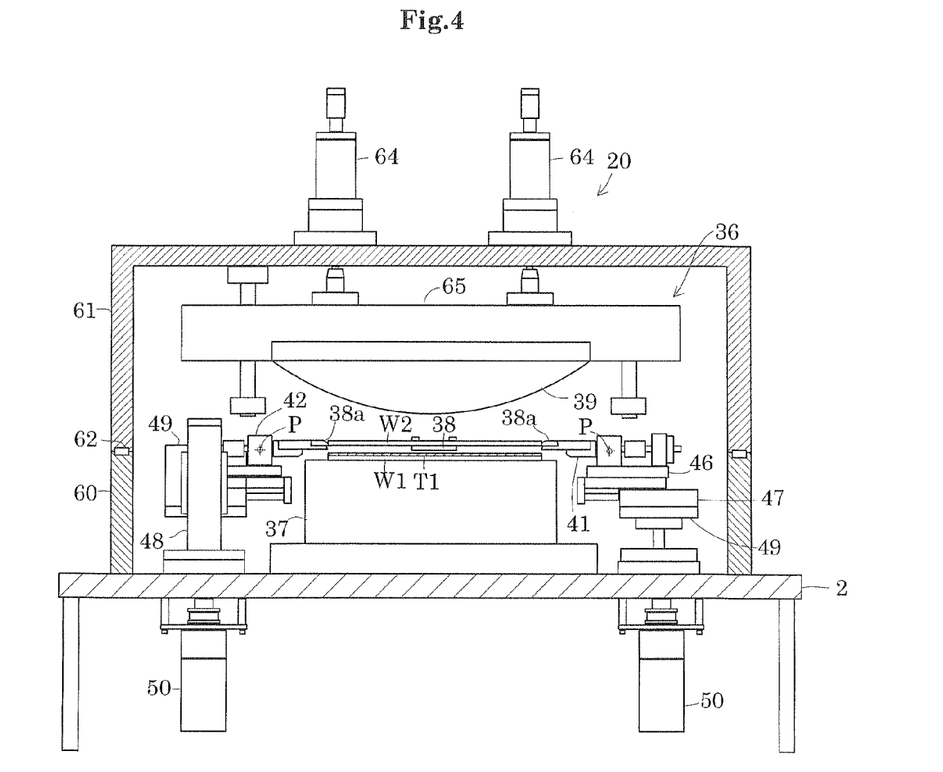
FIG. 4 is a front view of a mechanism for laminating a substrate of the present invention.

As illustrated in FIG. 4, the mechanism for laminating the substrate 20 is provided on the base 2 has a configuration installed in an openable and closable decompression chamber 36. The mechanism for laminating the substrate 20 is equivalent to the apparatus for laminating the substrate of the present invention.

Figure 3:
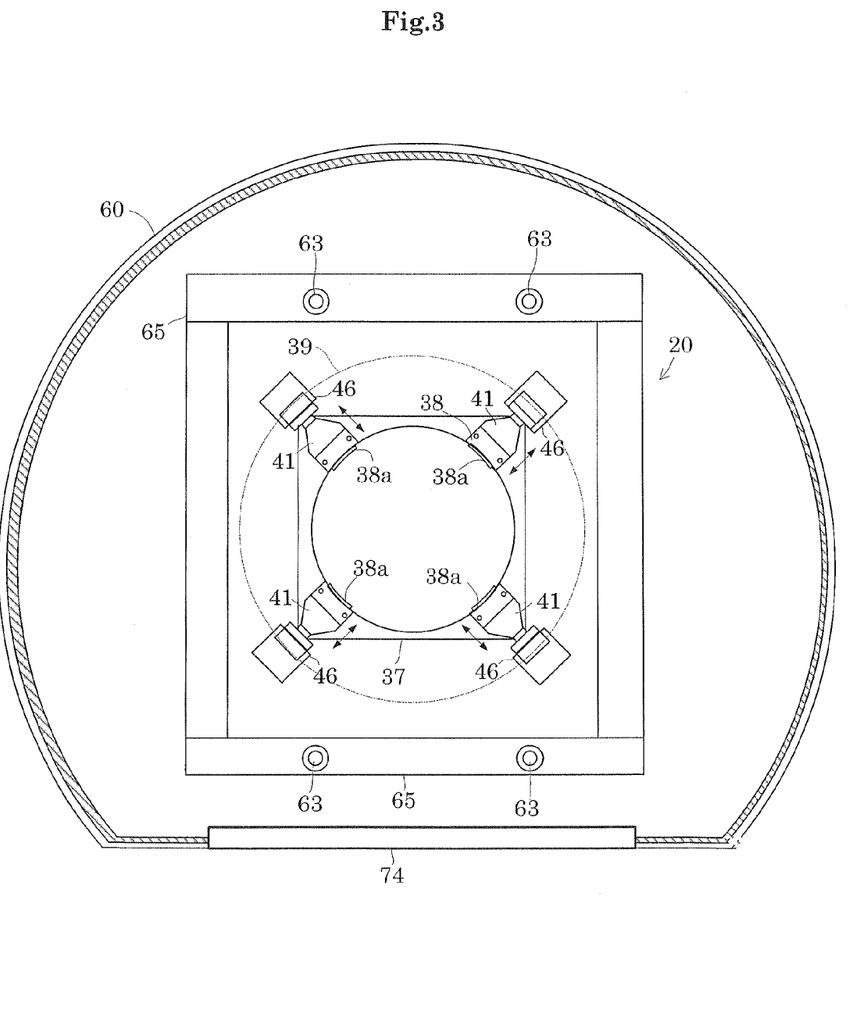
FIG. 3 is a plan view of a mechanism for laminating a substrate of the present invention.

Furthermore, as illustrated in FIG. 3 and FIG. 4, the mechanism for laminating the substrate 20 includes:
a holding table 37 of a vacuum absorption type for mounting and holding the wafer W1 in a horizontal attitude;
two pairs of locking claws 38 facing each other for locking the peripheral edge of the supporting substrate W2 at four points;
a pressing member 39 in a waiting position over the supporting substrate W2 in a condition for locking the substrate W2 with these locking claws 38; and
a driving device for these mechanisms. Detailed structure of each configuration will be described hereinafter.

The locking claw 38 is detachably linked with a holder 41 with a bolt. A locking part 38*a* having a shape of a segment of a circle for catching and locking the peripheral edge part of the supporting substrate W2 from downward at the edge part of the locking claw 38 in an uneven parallel position. The locking claw 38 is equivalent to the holding device of the present invention.

In a plan view, the holder 41 is swingablly supported by a bearing bracket 42 from a horizontal attitude to a slanting attitude downward with a horizontal axial center P as fulcrum, and the bearing bracket 42 is mounted on the movable base 46. The movable base 46 is mounted on a lifting stage 49, and is driven by a linear horizontal drive mechanism 47 that is screw-fed with an air cylinder or a pulse motor so as to allow transverse and horizontal movement. That is, each locking claw 38 can travel between a holding position of the substrate, and a retracted position outside the substrate. The linear horizontal drive mechanism 47 is equivalent to the driving device of the present invention.

Furthermore, the linear horizontal drive mechanism 47 itself is mounted on the lifting stage 49 allowing ascending and descending along with a rail 48 installed upright on the base. This lifting stage 49 ascends or descends with screw feed using a drive mechanism 50, such as an air cylinder or a pulse motor to ascend and descends each locking claw 38.

Figure 5:
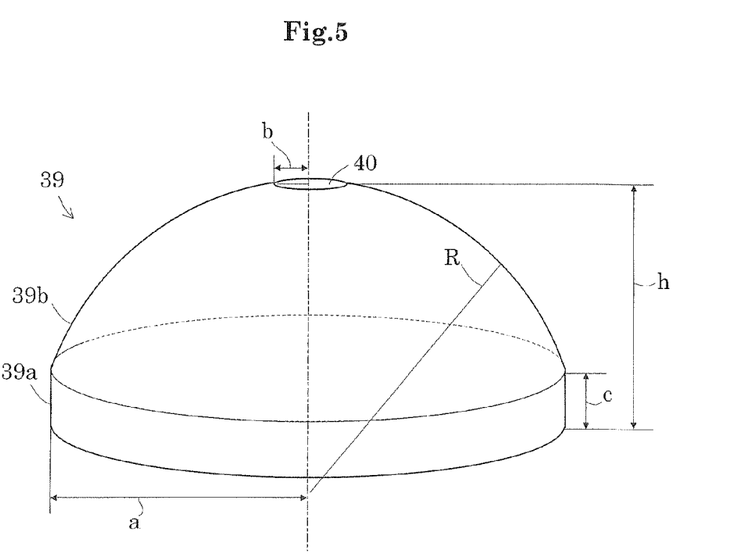
FIG. 5 is a perspective view of a pressing member.

The pressing member 39 is made of an approximately hemispherical elastic body having a larger diameter than a diameter of the wafer W1. For example, the top end serving as a starting point of pressing of the pressing member 39 has a flat surface 40 in the case of an apparatus by this example as illustrated in FIG. 5. This flat surface 40 can suppress the local action of the pressing force by the pressing member 39 on the supporting substrate W2. In other words, this flat surface 40 allows dispersion of the pressing force in a radial direction of the supporting substrate W2, leading to the action of an approximately uniform pressing force on the supporting substrate W2. Accordingly, suppression of breakage of the wafer W1, and efficient elimination of air bubbles to be possibly involved in an adhering surface may be attained. As a result, closer contact between the supporting substrate W2 and the wafer W1 will be attained without lamination non-uniformity in the peripheral part of the wafer W1.

Furthermore, the pressing member 39 has a cylindrical block 39*a* in an attached base end side. A height c of this cylindrical block 39*a*, a radius a, a radius of curvature R, and a radius b of the flat surface 40 of the hemispherical block 39*b*, a height h from the mounting attached base end surface to the top end of the block 39*b* and a hardness of the cylindrical block 39*a* etc. are suitably determined based on the size and the material of the wafer W1 to be laminated. That is, the height c of the cylindrical block 39*a*, is determined so that the portion of the hemispherical block 39*b* may give a height, in elastic deformation by pressing, for allowing deformation without any stress in a diameter direction and a height direction. The radius of the curvature R is determined in a range so that the pressing force spreads in a diameter direction (radial direction) of the supporting substrate W2 to give a uniform pressing force (surface pressure) to the supporting substrate W2. The radius a preferably has such a size that forces the elastically deformed pressing member 39 to contact the whole surface of the supporting substrate W2 and to cover the supporting substrate W2 in laminating the supporting substrate W2 on the wafer W1. For example, the size is approximately twice the diameter of the wafer W1. The radius b of the flat surface 40 is determined for a contact area to give a uniform surface pressure.

Furthermore, the pressing member 39 is preferably made of materials having a low friction coefficient and high heat resistance, and more preferably a low hardness. For example, preferably used are materials molded into a hemispherical block or a balloon with silicone rubbers, fluoro-rubbers, etc.

For example, When these conditions for the pressing member 39 are applied for lamination of a supporting substrate W2 having the same shape to a 6-inch wafer W1, detailed conditions are in the ranges of:
the radius a of 600 mm;
the radius b of the flat surface 40 of 1 to 10 mm;
the height c of the cylindrical block 39*a* of 10 to 40 mm;
the radius of curvature R of 150 to 300 mm;
the height h of the sum of both blocks 39*a* and 39*b* of 50 to 150 mm; and
the hardness (Shore hardness) of 5 to 30. More preferable conditions are:
the radius a of 600 mm;
the radius b of the flat surface 40 of 3 mm;
the height c of 25 mm; and
the radius of curvature R of 200 mm.

The top end has a hardness (Shore hardness) of 15, and the hardness increases from this top end gradually to the base end to give 20 at the base end part.

Here, although the above-described radius of curvature R is determined based on the assumption that the hemispherical block 39*b* has a spherical shape, methods of determination are not limited to the method.

Furthermore, the pressing member 39 is disposed for allowing ascending and descending within a cover case 61.

That is, the cover case 61 includes an ascending and descending frame 65 that is up-and-down slidable by four guide shafts 63 and that ascends and descends by an air cylinder 64. This ascending and descending frame 65 is equipped with the pressing member 39. The pressing member 39, the guide shaft 63, the air cylinder 64, the ascending and descending frame 65, etc. work as a the laminating device of the present invention.

As illustrated in FIG. 3 and FIG. 4, the decompression chamber 36 is constituted with an approximately cylindrical fixed peripheral wall 60 provided on the base, and a cover case 61 equipped to the fixed peripheral wall 60 via a hinge (not illustrated) in a vertically swingable, and openable and closable condition. Here, operation of a vacuum pump (not illustrated) enables pressure reduction of the interior of the chamber. In addition, all the peripheries of the upper end of the fixed peripheral wall 60 are equipped with a seal 62 in order to keep the interior of the chamber airtight by contact to all the peripheries of the lower end of the closed cover case 61. Furthermore, a shutter 74 allowing slide opening and closing is provided in a side face having a flat surface. That is, the wafer W1 and the supporting substrate W2 that are suction-held by the robot arm 17 are carried in from a shutter opening, and each of the wafer W1 and the supporting substrate W2 is held on the holding table 37 and with each locking claw 38.

Next, a series of operation for laminating the supporting substrate W2 on the wafer W1 will be described using an apparatus by the above-described example with reference to Figures.

When initial setting, such as charge of each of the cassettes C1 to C3 and setting of the double-sided adhesive sheet T1 is completed, operation of the apparatus starts. First, the first transport mechanism 7 rotates, and the substrate holding section 21 of the robot arm 6 of this mechanism is inserted in a clearance between the wafers in the cassette C1. The robot arm 6 suction-holds the wafer W1 from the back side with the substrate holding section 21, and transports the wafer W1 to the first alignment stage 9.

The position control is performed based on an orientation flat or a notch of the wafer W1 mounted in the first alignment stage 9. The wafer W1 suction-held by the robot arm 6 from the back side is transported to the chuck table 23 after position control.

Position control of the wafer W1 mounted in the chuck table 23 is performed, and it is suction-held. The sheet laminating device 13 and the sheet separating mechanism 14 are located in a left-hand side initial position, and the cutter unit 15 is located in an upper waiting position at this time as illustrated in FIG. 6.

Figure 7:
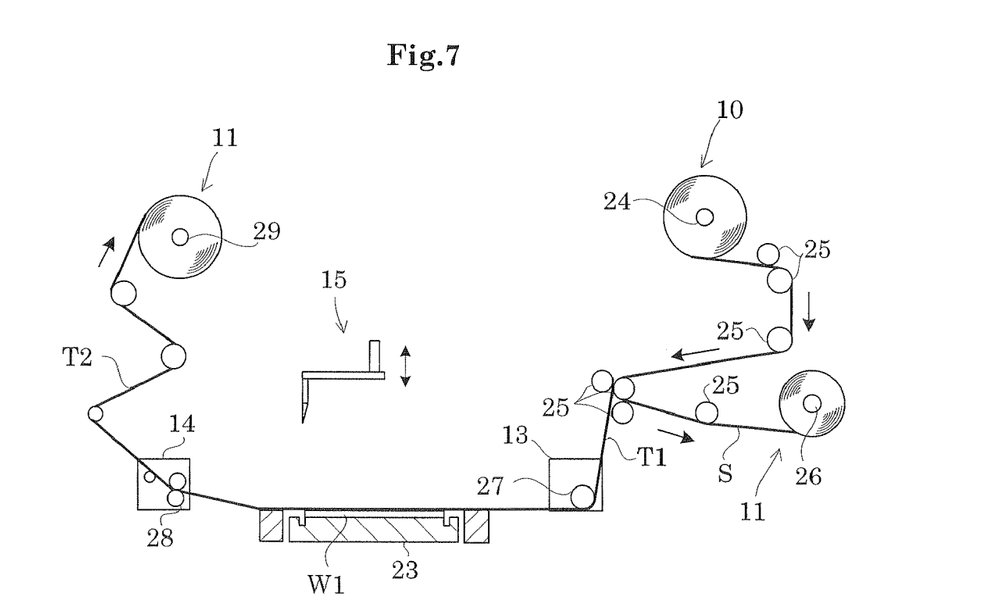

The laminating roller 27 of the sheet laminating device 13 rotates in a direction opposite to the sheet running direction (from left to right in FIG. 7) while it presses the surface of the double-sided adhesive sheet T1, after position control of the wafer W1 as illustrated in FIG. 7. This operation uniformly laminates the double-sided adhesive sheet T1 on the whole surface of the wafer W1.

Figure 8:
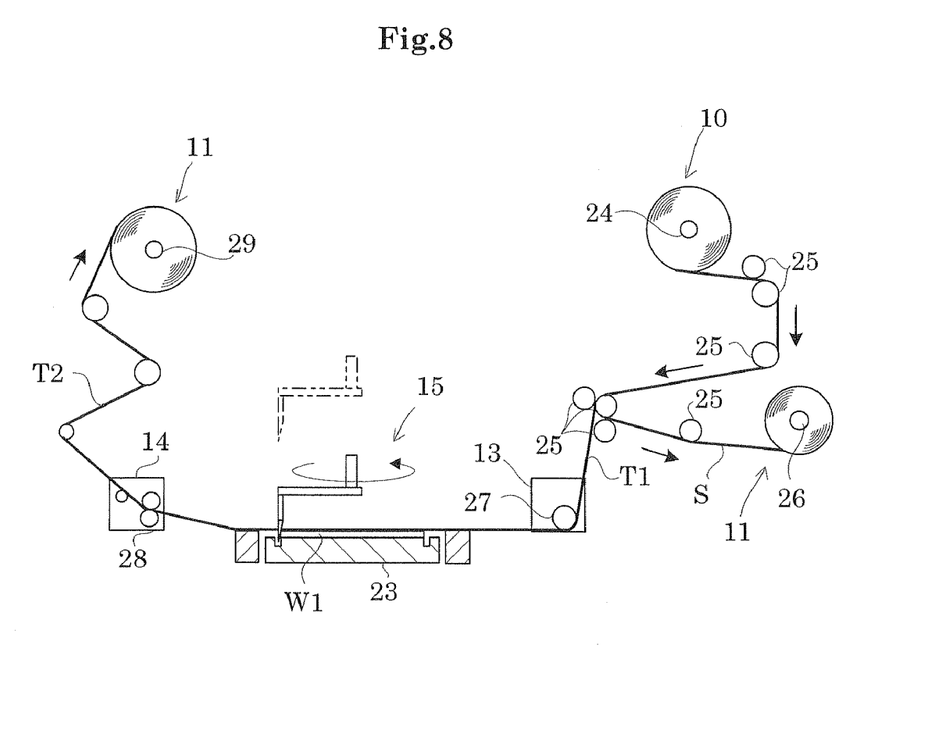

When the sheet laminating device 13 arrives at an end position, the cutter unit 15 descends in a cutting processing position, and then the edge of a blade is stuck in the double-sided adhesive sheet T1, and penetrates it, as illustrated in FIG. 8. Rotation of the edge of the blade cuts the double-sided adhesive sheet T1 in an approximate wafer shape along with the peripheral edge of the wafer W1.

Figure 9:
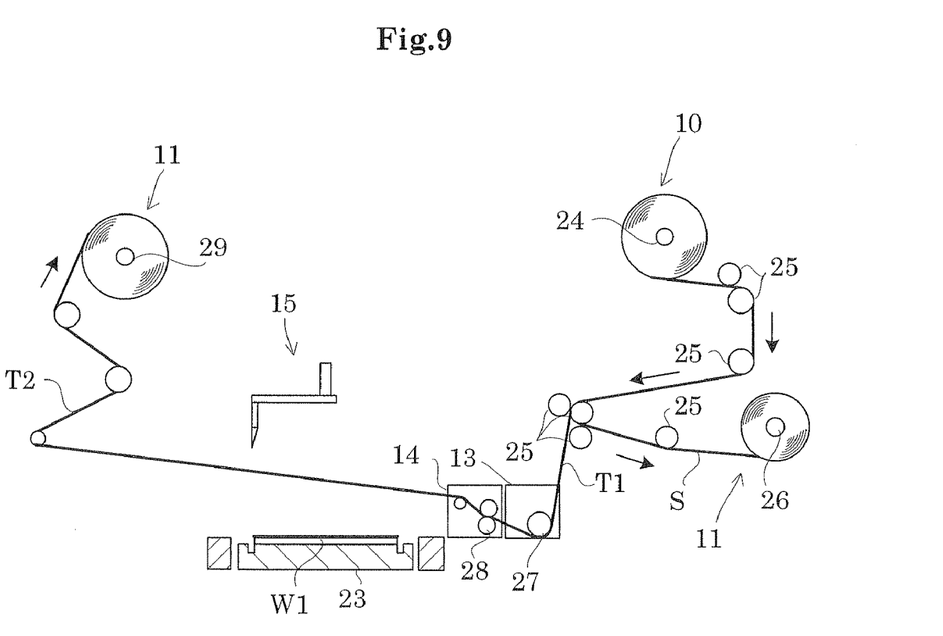

After cutting of the double-sided adhesive sheet T1, the cutter unit 15 ascends and returns to the waiting position, as illustrated in FIG. 9.

Subsequently, the sheet separating mechanism 14 separates the unnecessary sheet T2 that has been cut on the wafer W1 by winding up, while the sheet separating mechanism 14 moves on the supporting substrate W2 in a direction opposite to the sheet running direction (from left to right in FIG. 9).

When the sheet separating mechanism 14 arrives at the end position of separating operation, the sheet separating mechanism 14 and the sheet laminating device 13 move in the sheet running direction, and return to the initial position illustrated in FIG. 6. At this time, while the unnecessary sheet T2 is taken up by the collecting bobbin 29, a fixed amount of the double-sided adhesive sheets T1 is delivered out from the adhesive sheet feed section 10. The separator remained on the surface of the double-sided adhesive sheet T1 is timely separated.

The robot arm 6 sucks again the wafer W1 having the double-sided adhesive sheet T1 laminated thereon, and transports it to the second transport mechanism 8. The second transport mechanism 8 horizontally conveys the mounted wafer W1 to a delivery position of the second robot arm 17.

The wafer W1 transported by the second transport mechanism 8 in a delivery position is suction-held by the robot arm 17 from a downward face that is an non-adhering surface, then transported to the second alignment stage 19, and position control based on the notch etc. is performed. After position control, the wafer W1 suction-held by the robot arm 17 from the back side is transported to the holding table 37 in the decompression chamber of the mechanism for laminating a substrate 20. The wafer W1 is standing ready in a condition that the wafer W1 is suction-held with the holding table 37 until the supporting substrate W2 is transported by the mechanism for laminating a substrate 20.

When the wafer W1 is mounted on the holding table 37, the second robot arm 17 will start conveyance of the supporting substrate W2. That is, the second robot arm 17 inserts the substrate holding section 22 at the edge part thereof into a clearance between the supporting substrates W2 in the cassette C2. The robot arm 17 removes out the supporting substrate W2 with the substrate holding section 22 by suction-hold from the back side, and transports the supporting substrate W2 to the second alignment stage 19.

The second alignment stage 19 performs position control by catching the supporting substrate W2 with a pair of locking claws 75. After position control is completed, the robot arm 17 suction-holds the supporting substrate W2 from a downward surface that is a non-adhering surface thereof, turns over the supporting substrate W2 in the upper position, and transports it into the decompression chamber of the mechanism for laminating a substrate 20. Some of the substrates among the supporting substrates W2 do not need turning over after the position control.

When the supporting substrate W2 is transported in, each locking claw 38 is horizontally moved to a predetermined position at the side of the center of the substrate that has been determined based on information beforehand inputted corresponding to the diameter of the supporting substrate W2. Then the locking part 38a of these locking claws 38 locks and holds the supporting substrate W2 by four-point support in a horizontal attitude. After lock hold is completed, the robot arm 17 is retracted from the decompression chamber 36. At this time, the wafer W1 suction-held by the holding table 37 and the supporting substrate W2 lock-held by the locking claws 38 are in a proximate facing condition.

When loading of the wafer W1 and the supporting substrate W2 is completed, the shutter 74 of the decompression chamber 36 is closed and sealed. Subsequently the internal pressure is decompressed, for example, at a pressure not more than 65 KPa (500 mmHg) by exhausting process. At this point of time, the pressing member 39 is in a waiting state over the supporting substrate W2.

When the decompression process is completed, a lamination start command is issued and lamination of the supporting substrate W2 to the wafer W1 is started.

Figure 10:
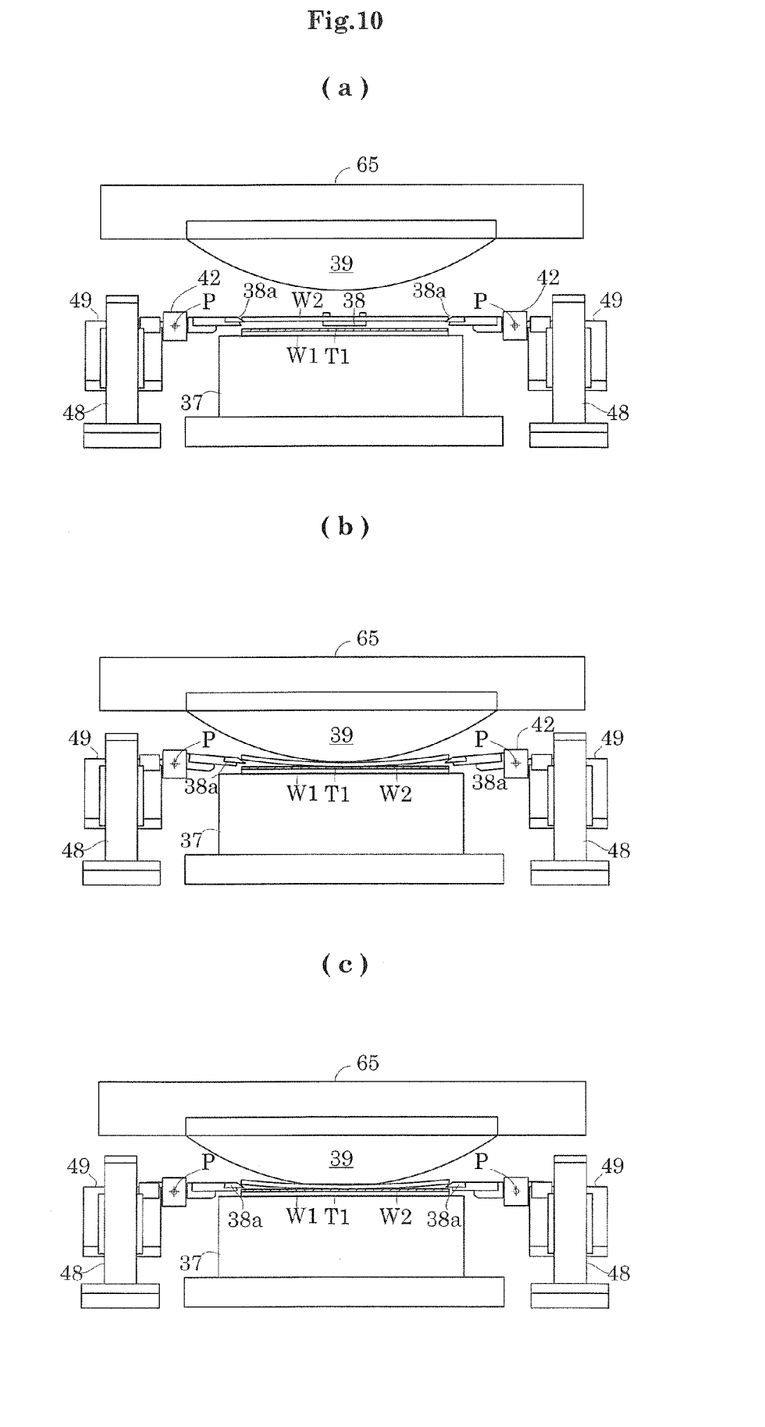
FIG. 10 is a view illustrating a laminating operation of a supporting substrate.

That is, as illustrated in FIG. 10(*a*), when the lamination command is issued, the pressing member 39 in the upper waiting position of the supporting substrate W2 starts drop as illustrated in FIG. 10(*b*).

Following this drop operation, the downward edge part of the pressing member 39 contacts to the approximate center of the supporting substrate W2, and presses the position to form a slight flexion to the supporting substrate W2, and thereby lamination between the center portions of the supporting substrate W2 and the wafer W1 is performed. At this time, the undersurface at the edge part of the locking claws incline with the head thereof facing down corresponding to the flexion amount of the supporting substrate W2, and to an extent to avoid contact to the double-sided adhesive sheet T1.

As the pressing member 39 is dropped further associated with elastic deformation of the pressing member 39, as illustrated in FIG. 10(*c*), the supporting substrate W2 is gradually laminated to the wafer W1, while the supporting substrate W2 is radially magnifying the contact area. At this time, the locking claw 38 descends to give a horizontal attitude so that the flexion amount of the supporting substrate W2 gives a fixed value.

Furthermore, this elastic deformation of the pressing member 39 magnifies the contact area to the supporting substrate W2. When the deformation comes to a predetermined position close to the peripheral edge of the supporting substrate W2, as illustrated in FIG. 11(*a*), the locking claw 38 cancels the lock-hold of the supporting substrate W2 and retracts outside of the substrate in order that the locking claw 38 may avoid blocking of the lamination of the supporting substrate W2.

Figure 11:
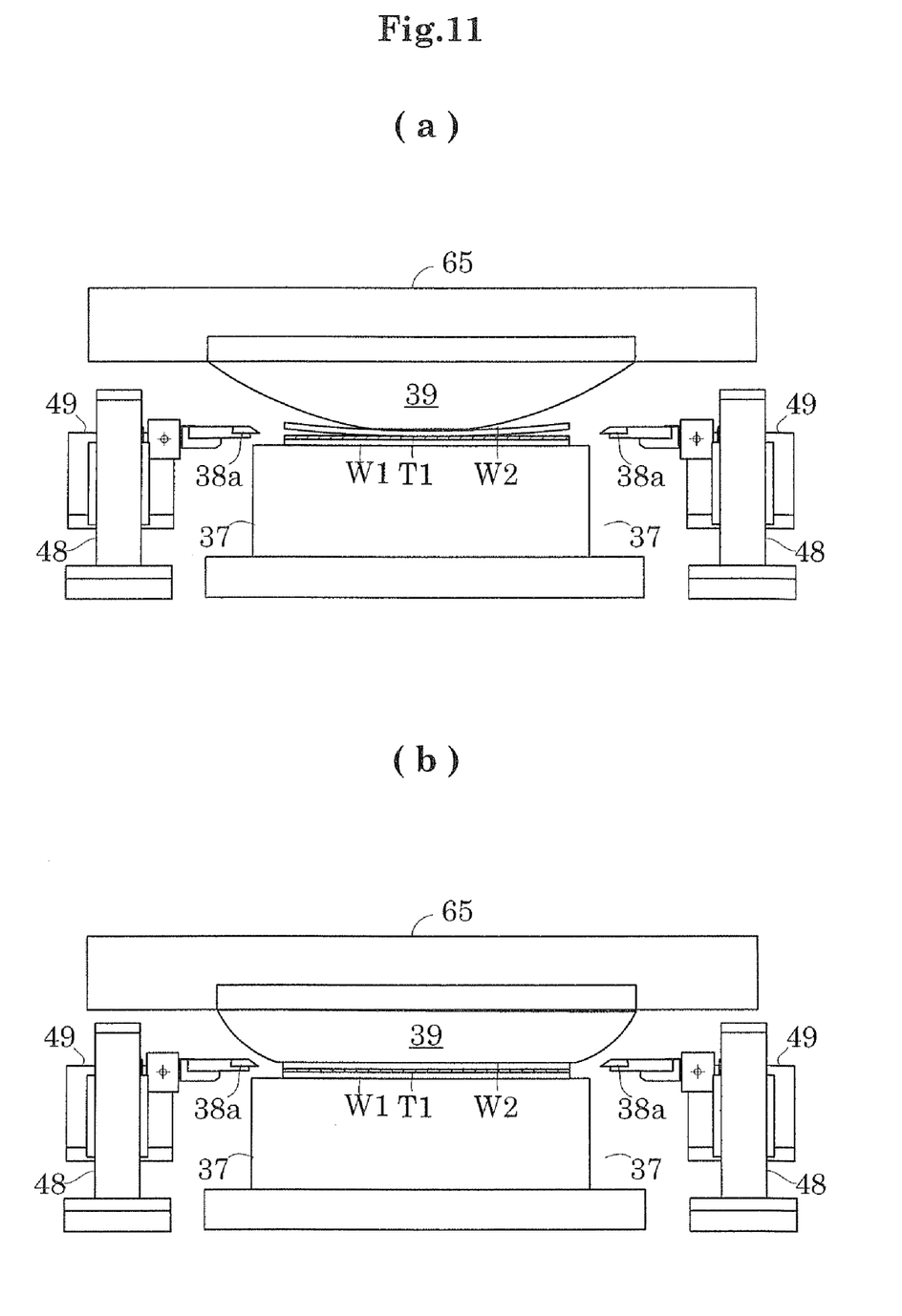
FIG. 11 is a view illustrating a lamination operation of a supporting substrate.

Subsequently, as illustrated in FIG. 11(*b*), the pressing member 39 is further pressed, and thereby the elastically deformed pressing member 39 covers the whole surface of the non-adhering surface of the supporting substrate W2, leading to completion of the lamination of the supporting substrate W2 to the wafer W1.

When the lamination is completed, the pressing member 39 ascends and returns to the waiting position, ambient air is introduced to return the decompression chamber 36 to the atmospheric pressure, and subsequently the shutter 74 opens.

The robot arm 17 inserts the substrate holding section 22 at the edge thereof from the opening of the shutter, and removes out the wafer W1 having the supporting substrate W2 laminated thereonto by suction hold. The robot arm 17 stores this removed wafer W1 into the cassette C3. One lamination process is completed in the above-described operation. The above-described operation is repeated, according the need.

Lamination of a supporting substrate W2 having the same diameter to that of the wafer W1 was illustrated in the above-described example, and the method of the present invention can be also performed by the same operation as in the above-described example in case of lamination of a supporting substrate W2 having a diameter a little smaller than that of the wafer W1.

In the above-described example, pressing by the pressing member 39 is performed from the approximate center of the supporting substrate W2 lock-held with the locking claw 38 accompanied by elastic deformation of the pressing member 39, and the supporting substrate W2 is gradually laminated to the wafer W1 while radially magnifying the contact area in an outside direction of the supporting substrate W2. This method can suppress unexpected gap of the lamination position in lamination of the supporting substrate W2 to the wafer W1.

Furthermore, application of approximately uniform pressing force may be obtained by lamination of the supporting substrate W2 to the wafer W1 accompanied by radially distribution of the pressing force in an outer direction of the wafer W1. Accordingly, avoidance of local application of the pressing force to the wafer W1 can suppress breakage of the wafer W1, etc. in lamination.

Furthermore, lamination in a radial direction of the supporting substrate W2 to the wafer W1 from the approximate center thereof can efficiently eliminate air bubbles that may possibly be involved in the adhering surface.

The present invention is not limited to the above-described example, and may be implemented in modified manners as follows.

(1) In the above-described example although the wafer W1 is held on the holding table 37 of the mechanism for laminating a substrate 20 to perform lamination of the supporting substrate W2, the arrangement may be reversed. That is, the supporting substrate W2 having a surface to be laminated upward is held on the holding table 37, and lamination is performed in a condition wherein the wafer W1 having a pattern surface side downward is locked and held with the locking claws 38.

(2) The hardness of the pressing member 39 of the above-described example preferably becomes higher from the center of the downward top end to contact to the supporting substrate W2 first in a radial direction and/or from the top end to the base end side. For example, blending of materials of the elastic body may be adjusted so that the hardness may become higher to the top end from the base end side, and blocks of elastic bodies each having a different hardness may be laminated with each other. This configuration enables efficient elimination of air bubbles to be involved in the adhering surface to the exterior.

(3) The pressing member 39 may be a hemispherical block that does not have the flat surface 40 at the top end, and that has the same curvature.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for laminating a supporting substrate to a workpiece by interposition of a double-sided adhesive sheet, the method comprising:

applying the double-sided adhesive sheet on the workpiece;

performing position control of the workpiece and the substrate in a proximate and mutually facing condition with interposition of the laminated double-sided adhesive sheet by holding a peripheral edge of the substrate with a plurality of holding devices;

laminating the substrate to the workpiece by pressing the substrate from the approximate center of a non-adhering surface of the substrate, by elastically deforming a pressing member into a flat shape to make a surface of the substrate contact to the workpiece using the pressing member made of an elastic body having an approximately hemispherical shape, and by swinging or descending edges of the plurality of holding devices with diagonal drop associated with a curvature caused by pressing of a surface of the substrate by the pressing member; and moving the holding devices outward in a radial direction of the substrate by canceling hold of the substrate by the holding device, when a pressed contact surface to the surface of the substrate by elastic deformation of the pressing member approaches the peripheral edge of the substrate.

2. The method for laminating a substrate according to claim 1, wherein
a hardness of the pressing member is increased from a top end in contact with the substrate to an attached base end side in the lamination process.

3. The method for laminating a substrate according to claim 1, wherein
a hardness of the pressing member is radially increased from a center at the top end in contact with the substrate in the lamination process.

4. The method for laminating a substrate according to claim 1, wherein
a flat surface is formed at a top end of the pressing member to be in contact with the substrate, and the pressing member is contacted to the substrate first from the flat surface gradually to an outer direction.

5. The method for laminating a substrate according to claim 1, wherein
lamination of the supporting substrate to the workpiece is performed under a decompressed atmosphere in the lamination process.

6. A method for laminating a supporting substrate to a workpiece by interposition of a double-sided adhesive sheet, the method comprising:
applying the double-sided adhesive sheet on the substrate;
performing position control of the workpiece and the substrate in a proximate and mutually facing condition with interposition of the laminated double-sided adhesive sheet by holding peripheral edge of the workpiece with a plurality of holding devices;
laminating the workpiece on the substrate by pressing the workpiece from the approximate center of an adhering surface of the workpiece with a pressing member made of an elastic body having an approximately hemispherical shape, by elastically deforming the pressing member into a flat shape and making the pressing member contact to the workpiece, and by swinging or descending edges of the plurality of holding devices with diagonal drop associated with a curvature caused by pressing of a surface of the substrate by the pressing member; and
moving the holding devices outward in a radial direction of the workpiece by canceling hold of the workpiece by the holding device when a pressed contact surface to the workpiece by elastic deformation of the pressing member approaches the peripheral edge of the workpiece.

7. The method for laminating a substrate according to claim 6, wherein
a hardness of the pressing member is increased from a top end in contact with the workpiece to an attached base end side in the lamination process.

8. The method for laminating a substrate according to claim 6, wherein
a hardness of the pressing member is radially increased from a center at a top end in contact with the workpiece in the lamination process.

9. The method for laminating a substrate according to claim 6, wherein
a flat surface is formed at a top end of the pressing member to be in contact with the workpiece, and the pressing member is contacted to the workpiece first from this flat surface gradually to an outer direction.

10. The method for laminating a substrate according to claim 6, wherein
lamination of the supporting substrate to the workpiece is performed under a decompressed atmosphere in the lamination.

11. An apparatus for laminating a supporting substrate to a workpiece by interposition of a double-sided adhesive sheet, the apparatus comprising:
a holding table for holding a non-adhering surface of the workpiece having the double-sided adhesive sheet laminated thereon;
a plurality of holding devices for holding a plurality of positions of a peripheral edge of the substrate and for disposing in proximity the substrate opposed to an adhering surface of the double-sided adhesive sheet on the workpiece held on the holding table;
a laminating device having a pressing member made of an approximately hemispherical elastic body, the pressing member pressing the non-adhering surface of the substrate held on the holding device, the laminating device laminating the substrate on the workpiece while making the surface of the substrate contact to the workpiece by elastically deforming the pressing member into a flat shape; and
a driving device for moving the holding devices outward in a radial direction of the substrate by swinging or descending edges of the plurality of holding devices with diagonal drop associated with a curvature caused by pressing of a surface of the substrate by the pressing member and by canceling hold of the substrate by the holding device when a pressed contact surface to the substrate approaches the peripheral edge of the substrate.

12. The apparatus for laminating the substrate according to claim 11, wherein
the pressing member has a flat surface at a top end of the hemispherical elastic body providing a starting position of contact.

13. The apparatus for laminating the substrate according to claim 11, wherein
a hardness of the pressing member is increased from a top end in contact with the substrate to an attached base end.

14. The apparatus for laminating the substrate according to claim 11, wherein
a hardness of the pressing member is radially increased from a center at a top end in contact with the substrate.

15. The apparatus for laminating the substrate according to claim 11, wherein
the holding device is configured with a plurality of locking claws for locking a peripheral edge of the substrate.

16. The apparatus for laminating the substrate according to claim 11, wherein
at least the holding table, the holding device, and the laminating device are accommodated in a decompression chamber.

17. An apparatus for laminating a supporting substrate to a workpiece by interposition of a double-sided adhesive sheet, the apparatus comprising:
a holding table for holding a non-adhering surface of the substrate having the double-sided adhesive sheet laminated thereon:
a plurality of holding devices for holding a plurality of positions of a peripheral edge of the workpiece and for disposing in proximity the workpiece opposed to an adhering surface of the double-sided adhesive sheet on the substrate held on the holding table;

a laminating device having a pressing member made of an approximately hemispherical elastic body, the pressing member pressing the non-adhering surface of the workpiece held on the holding device, the laminating device laminating the workpiece on the substrate while making the workpiece contact to the substrate by elastically deforming the pressing member into a flat shape; and a driving device for moving the holding devices outward in a radial direction of the workpiece by swinging or descending edges of the plurality of holding devices with diagonal drop associated with a curvature caused by pressing of a surface of the substrate by the pressing member and by canceling hold of the workpiece by the holding device when a pressed contact surface to the workpiece approaches the peripheral edge of the workpiece.

18. The apparatus for laminating the substrate according to claim 17, wherein
the pressing member has a flat surface at a top end of the hemispherical elastic body providing a starting position of contact.

19. The apparatus for laminating the substrate according to claim 17, wherein
a hardness of the pressing member is increased from a top end in contact with the workpiece to an attached base end.

20. The apparatus for laminating the substrate according to claim 17, wherein
a hardness of the pressing member is radially increased from a center at a top end in contact with the workpiece.

21. The apparatus for laminating the substrate according to claim 17, wherein
the holding device is configured with a plurality of locking claws for locking a peripheral edge of the workpiece.

22. The apparatus for laminating the substrate according to claim 17, wherein
at least the holding table, the holding device, and the laminating device are accommodated in a decompression chamber.

* * * * *